(12) United States Patent
Naasani et al.

(10) Patent No.: US 10,461,224 B2
(45) Date of Patent: Oct. 29, 2019

(54) MOLDED NANOPARTICLE PHOSPHOR FOR LIGHT EMITTING APPLICATIONS

(71) Applicant: Nanoco Technologies Ltd., Manchester (GB)

(72) Inventors: Imad Naasani, Manchester (GB); Hao Pang, Sale (GB)

(73) Assignee: Nanoco Technologies Ltd., Manchester (GB)

(*) Notice: Subject to any disclaimer, the term of this patent is extended or adjusted under 35 U.S.C. 154(b) by 95 days.

(21) Appl. No.: 16/101,052

(22) Filed: Aug. 10, 2018

(65) Prior Publication Data

US 2018/0346805 A1 Dec. 6, 2018

Related U.S. Application Data

(63) Continuation of application No. 13/743,414, filed on Jan. 17, 2013, now Pat. No. 10,066,158.

(Continued)

(51) Int. Cl.
*H01L 33/48* (2010.01)
*C09K 11/02* (2006.01)
(Continued)

(52) U.S. Cl.
CPC .......... *H01L 33/486* (2013.01); *C09D 165/00* (2013.01); *C09K 11/02* (2013.01);
(Continued)

(58) Field of Classification Search
CPC ........ C09K 11/02; C09K 11/70; C09K 11/56; C09D 165/00; C09D 4/00; Y10S 977/773;
(Continued)

(56) References Cited

U.S. PATENT DOCUMENTS

2003/0175004 A1* 9/2003 Garito .................. G02B 6/122
385/143
2006/0083694 A1 4/2006 Kodas et al.
(Continued)

FOREIGN PATENT DOCUMENTS

JP H03-045690 2/1991
JP 2008231313 10/2008
(Continued)

OTHER PUBLICATIONS

English translation of second Chinese Office Action received in corresponding Chinese patent application No. 20138000578.X.
(Continued)

*Primary Examiner* — Scott B Geyer
(74) *Attorney, Agent, or Firm* — Blank Rome, LLP

(57) ABSTRACT

A molded nanoparticle phosphor for light emitting applications is fabricated by converting a suspension of nanoparticles in a matrix material precursor into a molded nanoparticle phosphor. The matrix material can be any material in which the nanoparticles are dispersible and which is moldable. The molded nanoparticle phosphor can be formed from the matrix material precursor/nanoparticle suspension using any molding technique, such as polymerization molding, contact molding, extrusion molding, injection molding, for example. Once molded, the molded nanoparticle phosphor can be coated with a gas barrier material, for example, a polymer, metal oxide, metal nitride or a glass. The barrier-coated molded nanoparticle phosphor can be utilized in a light-emitting device, such as an LED. For example, the phosphor can be incorporated into the packaging of a standard solid state LED and used to down-convert a portion of the emission of the solid state LED emitter.

20 Claims, 4 Drawing Sheets

Related U.S. Application Data

(60) Provisional application No. 61/588,377, filed on Jan. 19, 2012.

(51) Int. Cl.
    *C09K 11/56*     (2006.01)
    *C09K 11/70*     (2006.01)
    *C09D 165/00*     (2006.01)
    *H01L 33/50*     (2010.01)
    *B82Y 40/00*     (2011.01)
    *C09D 4/00*     (2006.01)

(52) U.S. Cl.
    CPC .............. *C09K 11/56* (2013.01); *C09K 11/70* (2013.01); *H01L 33/505* (2013.01); *B82Y 40/00* (2013.01); *C08G 2261/3424* (2013.01); *C08G 2261/3442* (2013.01); *C08G 2261/95* (2013.01); *C09D 4/00* (2013.01); *H01L 2224/48227* (2013.01); *H01L 2933/0041* (2013.01); *Y10S 977/773* (2013.01)

(58) Field of Classification Search
    CPC ................ B82Y 40/00; C08G 2261/95; C08G 2261/3442; C08G 2261/3424; H01L 2933/0041; H01L 2224/48227; H01L 33/50; H01L 33/505; H01L 33/483; H01L 33/486
    See application file for complete search history.

(56) References Cited

U.S. PATENT DOCUMENTS

| | | |
|---|---|---|
| 2008/0237540 A1 | 10/2008 | Dubrow |
| 2010/0123155 A1 | 5/2010 | Pickett et al. |
| 2010/0148193 A1* | 6/2010 | Duong .................... H01L 33/20 257/88 |
| 2010/0155744 A1* | 6/2010 | Jang ........................ B32B 27/08 257/79 |
| 2010/0163914 A1* | 7/2010 | Urano .................... H01L 33/507 257/98 |
| 2011/0156081 A1 | 6/2011 | De Carvalho Esteves et al. |

FOREIGN PATENT DOCUMENTS

| | | |
|---|---|---|
| WO | 2008115498 A1 | 9/2008 |
| WO | 2011036446 A1 | 3/2011 |
| WO | 2011036447 A1 | 3/2011 |

OTHER PUBLICATIONS

English translation of third Chinese Office Action received in corresponding Chinese patent application No. 20138000578.X.

English translation of first Japanese Office Action received in corresponding Japanese patent application No. 2014-55271.

\* cited by examiner

MOLDED NANOPARTICLE PHOSPHOR FOR LIGHT EMITTING APPLICATIONS

CROSS-REFERENCE TO RELATED APPLICATIONS

This application is a continuation of U.S. Non-Provisional application Ser. No. 13/743,414, filed Jan. 17, 2013, which claims the benefit of U.S. Provisional Application No. 61/588,377, filed Jan. 19, 2012, the entire contents of which are hereby incorporated herein by reference.

BACKGROUND

There has been substantial interest in the preparation and characterization of compound semiconductors consisting of particles with dimensions in the order of 2-100 nm, often referred to as quantum dots (QDs) and/or nanoparticles. These studies have focused mainly on the size-tunable electronic, optical and chemical properties of nanoparticles. Semiconductor nanoparticles are gaining substantial interest due to their applicability for commercial applications as diverse as biological labeling, solar cells, catalysis, biological imaging, and light-emitting diodes.

A particularly attractive potential field of application for semiconductor nanoparticle is in the development of next generation light-emitting diodes (LEDs). LEDs are becoming increasingly important, in for example, automobile lighting, traffic signals, general lighting, and liquid crystal display (LCD) backlighting and display screens. Nanoparticle-based light-emitting devices have been made by embedding semiconductor nanoparticles in an optically clear (or sufficiently transparent) LED encapsulation medium, typically a silicone or an acrylate, which is then placed on top of a solid-state LED. The nanoparticles, excited by the primary light of the solid-state LED, emit secondary light, the color of which is characteristic of the particular type and size of the nanoparticles. For example, if the primary emission of the solid-state LED is blue and the characteristic emission of the particular nanoparticle is red, then the nanoparticles will absorb a portion of the blue light and emit red light. A portion of the solid-state LED emission is thereby "down-converted" and the device provides light that is a mixture of blue and red.

The use of semiconductor nanoparticles potentially has significant advantages over the use of the more conventional phosphors. For example, semiconductor nanoparticles provide the ability to tune the emission wavelength of a LED. However even after the nanoparticles have been incorporated into the LED encapsulant, oxygen can still migrate through the encapsulant to the surfaces of the nanoparticles, which can lead to photo-oxidation and, as a result, a drop in quantum yield (QY).

In view of the significant potential for the application of quantum dots across such a wide range of applications, including but not limited to, quantum dot-based light-emitting devices, there is a strong need to develop methods to increase the stability of quantum dots so as to make them brighter, more long-lived and/or less sensitive to various types of processing conditions. There remain significant challenges to the development of quantum dot-based materials and methods for fabricating quantum dot-based devices, such as light-emitting devices, on an economically viable scale and which would provide sufficiently high levels of performance to satisfy consumer demand.

SUMMARY OF THE DISCLOSURE

A molded nanoparticle phosphor for light emitting applications is fabricated by converting a suspension of nanoparticles in a matrix material precursor into a molded nanoparticle phosphor comprising a matrix material and the nanoparticles. The matrix material can be any material in which the nanoparticles are dispersible and which is moldable. For example, the matrix material can be a polymeric material. If the matrix material is a polymeric material, then the matrix material precursor can be a formulation of the appropriate monomers. The matrix material precursor may also contain catalysts, crosslinking agents, initiators, and the like.

The molded nanoparticle phosphor can be formed from the matrix material precursor/nanoparticle suspension using any molding technique, such as polymerization molding, contact molding, extrusion molding, injection molding, for example. Once molded, the molded nanoparticle phosphor can be coated with a gas barrier material, for example, a polymer, metal oxide, metal nitride or a glass. The coating can be applied to the molded nanoparticle phosphor by any coating technique, such as atomic layer deposition, evaporation coating, spray coating, or brush coating.

The barrier-coated molded nanoparticle phosphor can be utilized in a light-emitting device, such as an LED. For example, the phosphor can be incorporated into the packaging of a standard solid state LED and used to down-convert a portion of the emission of the solid state LED emitter.

The foregoing summary is not intended to summarize each potential embodiment or every aspect of the present disclosure.

DETAILED DESCRIPTION OF THE DISCLOSURE

Figure 1:
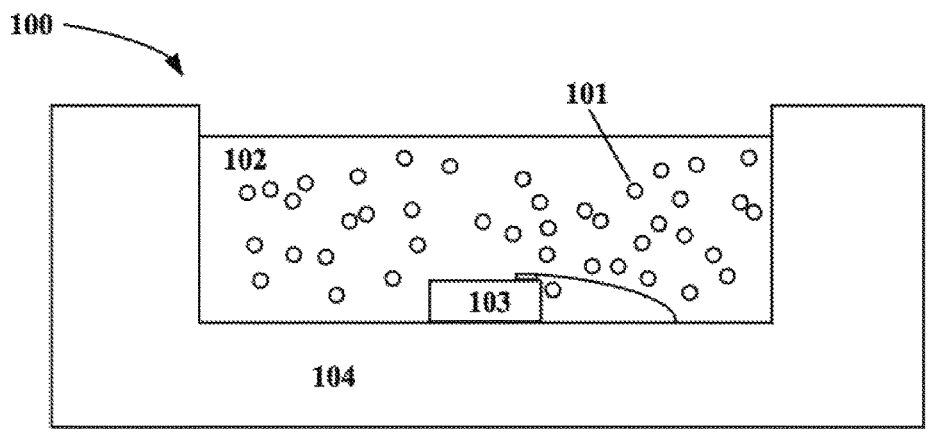
FIGS. 1-3 illustrate prior art nanoparticle-based light emitting devices.

FIG. 1 illustrates a prior art nanoparticle-based light-emitting device 100 as described in the background. The light-emitting device 100 has semiconductor nanoparticles 101 in an optically clear (or sufficiently transparent) LED encapsulation medium 102, typically a silicone or an acrylate, which is then placed on top of a solid-state LED 103. The encapsulation medium is contained within a package 104. As described above, even after the nanoparticles have been incorporated into the LED encapsulant, oxygen can still migrate through the encapsulant to the surfaces of the nanoparticles, which can lead to photo-oxidation and, as a result, a drop in quantum yield (QY).

Figure 2A:
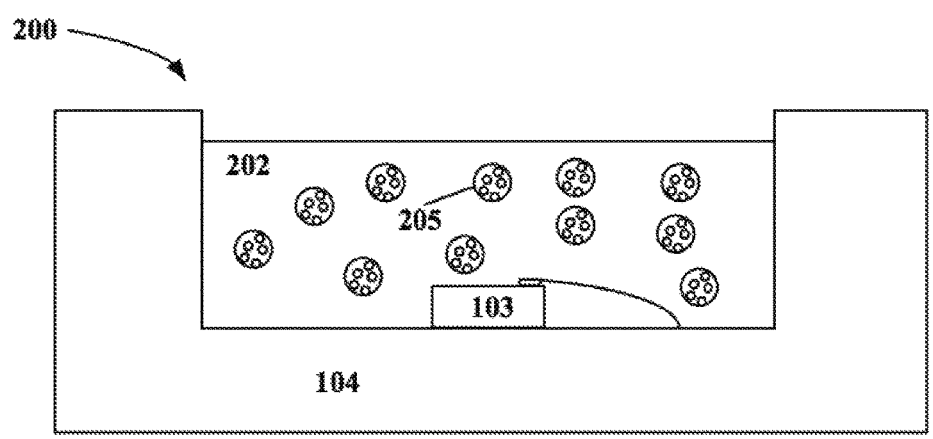
Figure 2B:
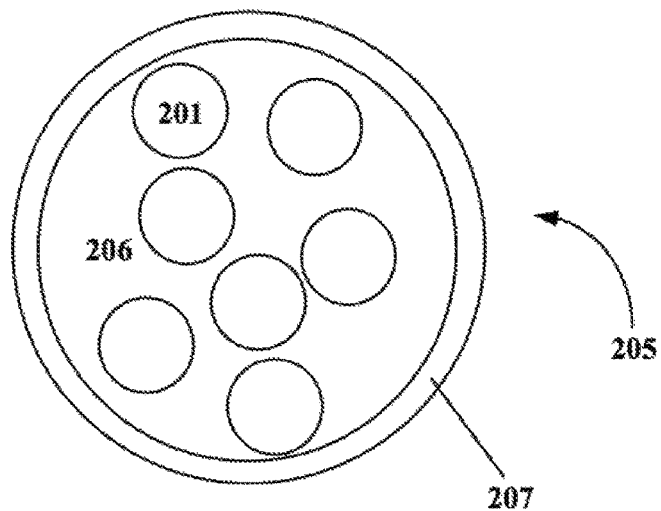

FIG. 2A illustrates a prior art nanoparticle-based light emitting device 200 that addresses the problem of photo-oxidation due to oxygen that migrates into the encapsulant 202. The nanoparticles 201 are incorporated into microbeads 205, which are suspended in the LED encapsulant 202. Bead 205 is illustrated in more detail in FIG. 2B. Nanoparticles 201 are incorporated into a primary matrix material 206. The primary matrix material is preferably an optically transparent medium, i.e., a medium through which light may pass, and which may be, but does not have to be substantially optically clear. The primary matrix may be a resin, polymer, monolith, glass, sol gel, epoxy, silicone, (meth)acrylate or the like, or may include silica. Examples of primary matrix materials include acrylate polymers (e.g., polymethyl(meth)acrylate, polybutylmethacrylate, polyoctylmethacrylate, alkylcyanoacrylates, polyethyleneglycol dimethacrylate, polyvinylacetate, etc.), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Microbead 205 may also include a coating 207 to prevent the passage or diffusion of oxygen, moisture, or free radicals through the primary matrix material. The coating may be an inorganic material, such as a dielectric, a metal oxide, a metal nitride, or silica. Alternatively, the coating may be another material, such as a polymer material.

Referring again to FIG. 2A, a drawback associated with microbeads 205 is that they scatter, reflect, and refract light. These optical effects lead to loss of overall performance (brightness) of the light-emitting device.

Figure 3:
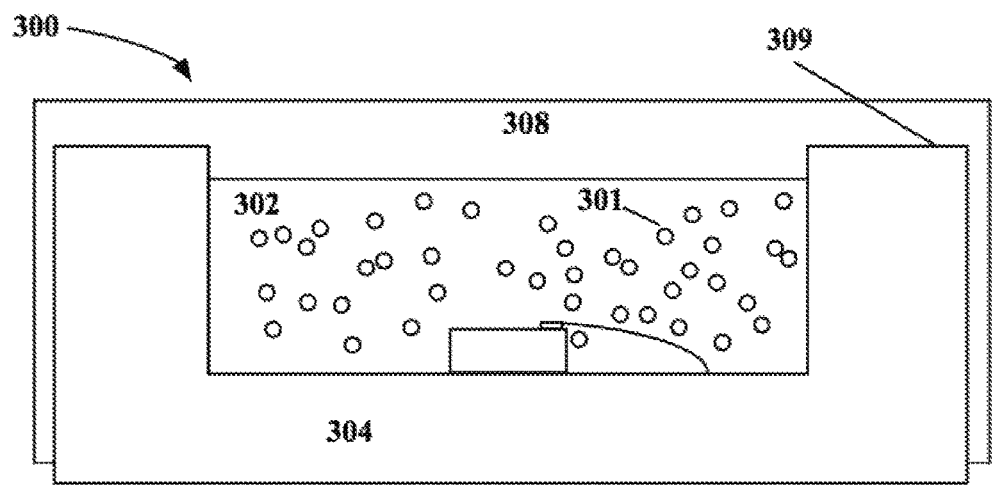

FIG. 3 illustrates a hermetically sealed nanoparticle-based light-emitting device 300 that includes a gas barrier film 308 sealed to LED package 304 to prevent migration of deleterious species such as oxygen, moisture, and radicals into encapsulant 302. However, a hermetically sealed device 300 is difficult to manufacture, particularly on a commercial scale, because materials suitable as a gas barrier 308 (e.g., ceramics) are expensive and difficult to work with. It can be difficult to achieve an impermeable seal between gas barrier 308 and LED package 304, and as a result, deleterious species may still diffuse into the device at interface 309. Moreover, it has recently been observed that sealed packaging can cause the development of micro-climate effects that deteriorate the performance of the LED wiring and emissive chip. So while it is desirable to prevent oxygen and the like from migrating into the LED encapsulant material, it is surprisingly also desirable that the LED packaging itself be allowed to "breath." An object of the present disclosure is to provide a nanoparticle-based light emitting device that fulfills these two seemingly contradictory goals.

Figure 4:
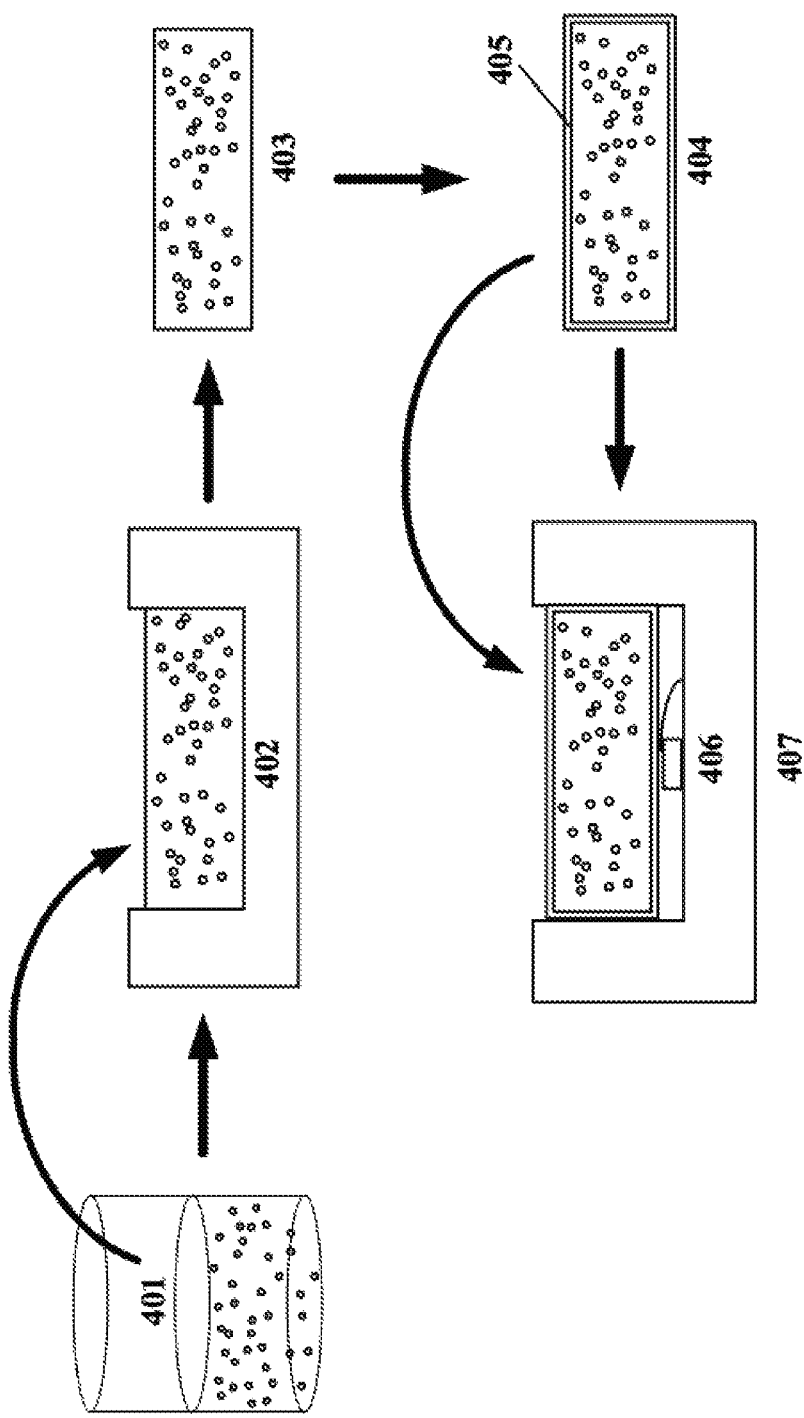
FIG. 4 illustrates a method of making a nanoparticle-based light emitting device with a prefabricated nanoparticle disc.

FIG. 4 illustrates a method of preparing a nanoparticle-based light emitting device that overcomes the problems described above. A suspension 401 of nanoparticles in a matrix material precursor is transferred to a mold 402. Once in the mold, the matrix material precursor is converted to the matrix material to yield a molded nanoparticle phosphor 403. Note that molded nanoparticle phosphor is schematically represented as being square-shaped in FIG. 4, but it will be appreciated that the actual shape of molded nanoparticle phosphor 403 will be determined by the shape of mold 402. The disclosure is not limited to any particular shape. Note also that FIGS. 1-4 are not to scale. Exemplary matrix materials include resins, polymers, sol gels, epoxies, silicones, (meth)acrylates or the like, or may include silica. Examples of matrix materials include acrylate polymers (e.g., polymethyl(meth)acrylate, polybutylmethacrylate, polyoctylmethacrylate, alkylcyanoacrylates, polyethyleneglycol dimethacrylate, polyvinylacetate, etc.), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Matrix material precursors may be any precursor formulation in which the nanoparticles can be suspended or dissolved and which can be converted to the matrix material. For example, if the matrix material is a polymer, then the matrix material precursor may be a formulation of the corresponding monomer and any additional species, such as photoinitiators, catalysts, and/or crosslinking agents for converting the matrix material precursor to the matrix material. According to one embodiment, in which the matrix material is an acrylate polymer, the matrix material precursor can be a formulation of the appropriate methacrylate monomer, a photoinitiator, and a crosslinking agent. The matrix material precursor can be converted to the matrix material by any method known in the art, including by not limited to, photoinitiated polymerization.

Mold 402 can be any mold having the shape to produce the desired shape of molded nanoparticle phosphor 403. According to one embodiment, mold 402 is itself LED packaging that is substantially identical to the LED packaging to be used in the final nanoparticle light-emitting device. The disclosure is not limited to any particular method of forming molded nanoparticle phosphor 403. Any known molding or casting technique can be used, for example, contact molding, casting, extrusion or injection molding.

Molded nanoparticle phosphor 403 can be coated with a gas barrier material to yield coated molded nanoparticle phosphor 404. The coating is preferably a barrier to the passage of oxygen or any type of oxidizing agent through the primary matrix material. The coating may be a barrier to the passage of free radical species through the primary matrix material, and/or is preferably a moisture barrier. It will be appreciated that the gas barrier material may not completely prevent the passage of gas and/or moisture.

The coating may provide a layer of coating material of any desirable thickness. For example, the surface layer coating may be around 1 to 10 nm thick, up to around 400 to 500 nm thick, or more. The coating can include an inorganic material, such as a dielectric (insulator), a metal oxide, a metal nitride or a silica-based material (e.g., a glass).

Preferred metal oxides are selected from the group consisting of $Al_2O_3$, $B_2O_3$, $Co_2O_3$, $Cr_2O_3$, $CuO$, $Fe_2O_3$, $Ga_2O_3$, $HfO_2$, $In_2O_3$, $MgO$, $Nb_2O_5$, $NiO$, $SiO_2$, $SnO_2$, $Ta_2O_5$, $TiO_2$, $ZrO_2$, $Sc_2O_3$, $Y_2O_3$, $GeO_2$, $La_2O_3$, $CeO_2$, $PrO_x$ (x=appropriate integer), $Nd_2O_3$, $Sm_2O_3$, $EuO_y$ (y=appropriate integer), $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $Bi_mTi_nO$ (m=appropriate integer; n=appropriate integer), $Bi_aSi_bO$ (a=appropriate integer; b=appropriate integer), $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$.

Preferred metal nitrides may be selected from the group consisting of BN, AlN, GaN, InN, $Zr_3N_4$, $Cu_2N$, $Hf_3N_4$, $SiN_c$ (c=appropriate integer), TiN, $Ta_3N_5$, Ti—Si—N, Ti—Al—N, TaN, NbN, MoN, $WN_d$ (d=appropriate integer), and WNeCf (e=appropriate integer; f=appropriate integer).

The inorganic coating may include silica in any appropriate crystalline form.

The coating may incorporate an inorganic material in combination with an organic or polymeric material. By way of example, in a preferred embodiment, the coating is an inorganic/polymer hybrid, such as a silica-acrylate hybrid material.

In a second preferred embodiment, the coating includes a polymeric material, which may be a saturated or unsaturated hydrocarbon polymer, or may incorporate one or more heteroatoms (e.g., O, S, N, halo) or heteroatom-containing functional groups (e.g., carbonyl, cyano, ether, epoxide, amide and the like).

Examples of preferred polymeric coating materials include acrylate polymers (e.g., polymethyl(meth)acrylate, polybutylmethacrylate, polyoctylmethacrylate, alkylcyanoacrylates, polyethyleneglycol dimethacrylate, polyvinylacetate, etc.), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, polypara-xylylene (parylenes), polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Coating 405 can be applied to molded nanoparticle phosphor 403 by any coating method known in the art and in related arts, such as the pharmaceutical arts, wherein coating are commonly applied to tablets and the like. Examples of coating methods include atomic layer deposition (ALD). Other methods include spray coating, evaporative and brush coating.

Coated molded nanoparticle phosphor 404 is inserted into LED packaging 406, which can be filled with an LED encapsulant, such as a silicone or epoxy, and the fabrication of nanoparticle-based light emitting device 407 can be completed according to typical practice in the LED industry.

The instant disclosure is not limited to any particular type of luminescent nanoparticle. In preferred embodiments, the nanoparticle is a semiconductor material. The semiconductor material may incorporate ions from any one or more of groups 2 to 16 of the periodic table, and may include binary, ternary and quaternary materials, that is, materials incorporating two, three or four different ions respectively. By way of example, the nanoparticle may incorporate a semiconductor material, such as, but not limited to, CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. According to various embodiments, nanoparticles may have diameters of less than around 100 nm, less than around 50 nm, less than around 20 nm, less than around 15 nm and/or may be in the range of around 2 to 10 nm in diameter.

Nanoparticles that include a single semiconductor material, e.g., CdS, CdSe, ZnS, ZnSe, InP, GaN, etc. may have relatively low quantum efficiencies because of non-radiative electron-hole recombination that occurs at defects and dangling bonds at the surface of the nanoparticles. In order to at least partially address these issues, the nanoparticle cores may be at least partially coated with one or more layers (also referred to herein as "shells") of a material different than that of the core, for example a different semiconductor material than that of the "core." The material included in the, or each, shell may incorporate ions from any one or more of groups 2 to 16 of the periodic table. When a nanoparticle has two or more shells, each shell may be formed of a different material. In an exemplary core/shell material, the core is formed from one of the materials specified above and the shell includes a semiconductor material of larger band-gap energy and similar lattice dimensions as the core material. Exemplary shell materials include, but are not limited to, ZnS, ZnO, MgS, MgSe, MgTe and GaN. An exemplary multi-shell nanoparticle is InP/ZnS/ZnO. The confinement of charge carriers within the core and away from surface states provides nanoparticles of greater stability and higher quantum yield.

While the disclosed methods are not limited to any particular nanoparticle material, nanoparticles comprising materials that do not contain cadmium are particularly favored because of increasing concern over potential toxic and environmental effects associated with cadmium. Examples of cadmium free nanoparticles include nanoparticles comprising semiconductor materials, e.g., ZnS, ZnSe, ZnTe, InP, InAs, InSb, AlP, AlS, AlAs, AlSb, GaN, GaP, GaAs, GaSb, PbS, PbSe, Si, Ge, and particularly, nanoparticles comprising cores of one of these materials and one or more shells of another of these materials.

EXAMPLE 1

Molded nanoparticle phosphors of the size of a standard 20 mw LED package were prepared by using an actual LED package as a mold. A solution of CFQD in toluene (for example 20 mg inorganic) is dried under vacuum to leave a QDs residue. To the residue laurylmethacrylate (1.85 ml, 6.6 mmol) is added to a solution of the photoinitiator (Irgacure 819, 9 mg) dissolved in the crosslinker trimethylolpropane trimethacrylate (1.06 ml, 3.3 mmol). An aliquot of the monomer mixture (1.5-3 ul) is used to fill the cup of an LED. The filled LED is then irradiated (Hamamatsu UV-LED lamp LC-L2, 365 nm, 7500 mW/cm$^2$, 3 minutes). The solidified molded nanoparticle phosphor is then removed from the LED by simple tapping and then processed for coating with gas barrier film (using for examples coating methods such as Atomic Layer Deposition-ALD and or high barrier materials like PVOH). The coated disc is then inserted into a new LED package that is filled with a proper encapsulating resin.

Figure 5:
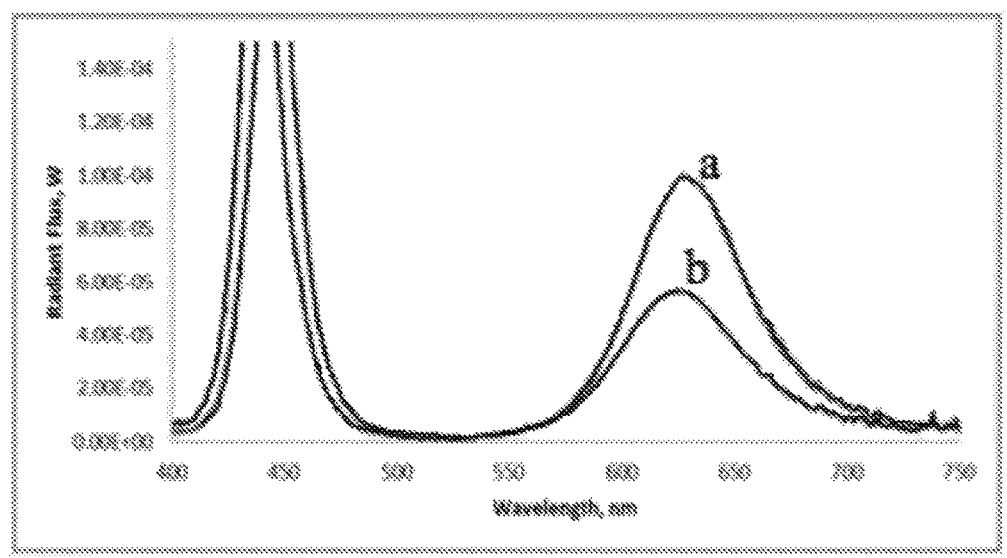
FIG. 5 is a comparison of emission intensity of an exemplary disclosed nanoparticle-based light emitting device and a prior art nanoparticle-based light emitting device.

FIG. 5 shows an emission spectrum produced by a cadmium free quantum dot nanoparticle-based (CFQD) (InP/ZnS) light emitting device using a molded nanoparticle phosphor (curve a), compared to a device using nanoparticles suspended in microbeads (curve b) of the same matrix material. The emission luminescence peak at about 630 nm is substantially higher with the molded nanoparticle phosphor device. The luminescence intensity is attenuated in the microbead-based device likely due to scattering by the multiple microbeads, as discussed above.

Figure 6:
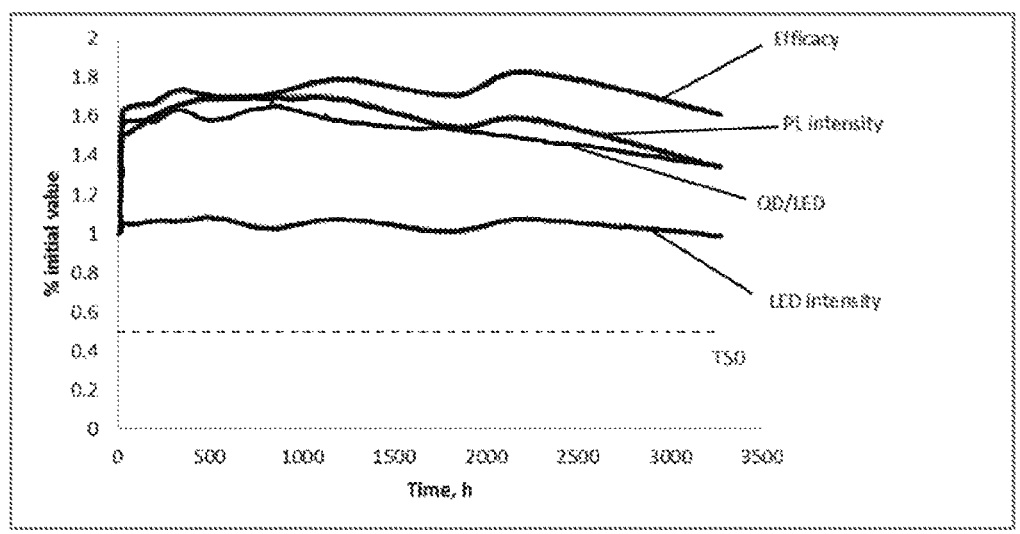
FIG. 6 shows the performance of an exemplary disclosed nanoparticle-based light emitting device.

FIG. 6 shows the efficacy (curve a, the total brightness of the LED based on human eye sensitivity), percent photoluminescence intensity of the QD peak alone (curve b), QD/LED intensity (curve c, the ratio between the QD peak alone and the blue chip peak), and LED intensity (curve d, the blue chip peak alone) a nanoparticle light emitting device using a molded nanoparticle phosphor, as disclosed herein.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A light emitting device, the device comprising:
   a light emitting diode (LED) package, the LED package comprising:
      a housing; and
      an LED located within the housing; and
   a phosphor composition disposed within the housing and in optical communication with the LED, the phosphor composition comprising:
      a molded matrix material;
      a plurality of nanoparticles suspended within the molded matrix material; and
      a gas barrier material coated upon every surface of the molded matrix material.

2. The light emitting device of claim 1, wherein the matrix material is a resin, a polymer or a sol gel.

3. The light emitting device of claim 2, wherein the resin is an acrylate resin.

4. The light emitting device of claim 3, wherein the acrylate resin is formed from laurylmethacrylate monomer, a photoinitiator and a crosslinker.

5. The light emitting device of claim 1, wherein the matrix material is an epoxy, a silicone, or an acrylate.

6. The light emitting device of claim 1, wherein the gas barrier material is a polymer, a metal oxide, a metal nitride or a glass.

7. The light emitting device of claim 1, wherein the gas barrier material is an epoxy, a silicone, an acrylate, or a silica-acrylate hybrid material.

8. The light emitting device of claim 1, further comprising an LED encapsulation medium.

9. The light emitting device of claim 8, wherein the LED encapsulation medium is a silicone or an epoxy.

10. The light emitting device of claim 1, wherein each of the nanoparticles comprise a semiconductor material.

11. The light emitting device of claim 1, wherein each of the nanoparticles comprise a core and shell at least partially coating the core, the core having a first semiconductor material and the shell having a second semiconductor material.

12. The light emitting device of claim 11, wherein the first semiconductor material is any one of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, and any combination thereof.

13. The light emitting device of claim 11, wherein the second semiconductor material is any one of CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge, and any combination thereof, and wherein the first semiconductor material and the second semiconductor mater are different.

14. The light emitting device of claim 11, wherein the second semiconductor material is any one of ZnS, ZnO, MgS, MgSe, MgTe and GaN.

15. The light emitting device of claim 11, wherein the core is InP and the shell is ZnS.

16. The light emitting device of claim 1, wherein the barrier layer has a thickness between about 1 nm and about 500 nm.

17. A method of making a light-emitting device, the method comprising:
   providing a light emitting diode (LED) package, the LED package comprising:
      a housing; and
      an LED located within the housing;
   disposing a phosphor composition within the housing such that the phosphor composition is in optical communication with the LED, the phosphor composition comprising:
      a molded matrix material;
      a plurality of nanoparticles suspended within the molded matrix material; and
      a gas barrier material coated upon every surface of the molded matrix material.

18. The method of claim 17, further comprising encapsulating the LED with an encapsulating medium.

19. The method of claim 18, further comprising encapsulating the phosphor composition with the encapsulating medium.

20. The method of claim 18, wherein the LED encapsulation medium is a silicone or an epoxy.

* * * * *